United States Patent [19]
Heid

[11] Patent Number: 5,581,184

[45] Date of Patent: Dec. 3, 1996

[54] METHOD FOR PHASE CORRECTION OF NUCLEAR MAGNETIC RESONANCE SIGNALS

[75] Inventor: Oliver Heid, Bern, Switzerland

[73] Assignee: Siemens Aktiengesellschaft, Munich, Germany

[21] Appl. No.: 573,363

[22] Filed: Dec. 15, 1995

[30] Foreign Application Priority Data

Dec. 21, 1994 [DE] Germany .......................... 44 45 782.0

[51] Int. Cl.$^6$ ..................................................... G01V 3/00
[52] U.S. Cl. .......................................... 324/309; 324/318
[58] Field of Search .................................. 324/300, 307, 324/309, 310, 311, 312, 313, 314, 318, 322; 128/653.2

[56] References Cited

U.S. PATENT DOCUMENTS

| | | | |
|---|---|---|---|
| 4,937,526 | 6/1990 | Ehman et al. | 324/309 |
| 5,122,747 | 6/1992 | Riederer et al. | 324/309 |
| 5,185,574 | 2/1993 | Ehman et al. | 324/309 |
| 5,382,902 | 1/1995 | Taniguchi et al. | 324/309 |
| 5,427,101 | 6/1995 | Sachs et al. | 128/653.2 |

*Primary Examiner*—Michael Tokar
*Attorney, Agent, or Firm*—Hill, Steadman & Simpson

[57] ABSTRACT

In a pulse sequence wherein image echoes are acquired under readout gradients of alternating operational sign, a navigator echo is respectively acquired under a positive pulse index and a negative pulse of the readout gradient without phase coding. Both navigator echoes are sampled, digitized and Fourier-transformed. A linear phase response with which the image echoes are corrected with respect to the linear phase response is respectively determined for the positive and negative pulses of the readout gradient from an autocorrelation of the Fourier-transformed samples.

6 Claims, 3 Drawing Sheets

METHOD FOR PHASE CORRECTION OF NUCLEAR MAGNETIC RESONANCE SIGNALS

BACKGROUND OF THE INVENTION

In the known NMR pulse sequence referred to as the echo planar imaging (EPI) method, nuclear magnetic resonance signals are generated in rapid sequence as gradient echoes by continuously changing the polarity of a readout gradient. Due to the changing polarity of the readout gradient, the samples acquired from the nuclear magnetic resonance signals must be sorted upon entry into a raw data matrix such that the sorting direction changes from row to row of the raw data matrix. If only slight deviations occur from row to row, however, this leads to so-called N/2 ghosts, i.e. the actual image, given an image matrix of N×N points, is imaged again, generally with a different intensity, shifted by N/2 in the positive or negative direction with reference to the middle of the image matrix.

Several methods are known for solving this problem. U.S. Pat. No. 5,138,259 discloses a method wherein an adjustment scan is implemented before the actual measurement. This adjustment scan differs from the measurement scan only in that it is implemented without phase coding. A complete correction data matrix is acquired and from which various inadequacies of the measuring system can be determined and correction data for the actual measurement can be calculated. The overall measuring time, however, is lengthened with this method.

U.S. Pat. Nos. 4,644,279 and 4,970,457 disclose acquisition of a nuclear magnetic resonance signal, with (i.e., unactivated), at least one of the magnetic field gradients suppressed before the actual measurement, and this nuclear magnetic resonance signal is utilized for determining the basic magnetic field. Image disturbances that are produced by changes in the basic magnetic field can thus be eliminated.

Proceedings of the Society of Magnetic Resonance in Medicine, Vol. 3, 12th Annual Scientific Meeting, Aug. 14–20, 1993, page 1239 discloses a method wherein a phase-coding pulse is omitted in the middle of the k-space. Rows acquired in different directions of the k-space, that are employed as reference values, are thereby obtained. After a Fourier transformation, relative time shifts are determined from the reference rows in a two-stage method. The image data are corrected on the basis of the correction data acquired in this way. This method for acquiring the correction data, however, is rather complex and the omission of a phase-coding step leads to a discontinuity in the data acquisition that can negatively influence the image.

IEEE Transactions on Medical Imaging, Vol. MI-6, No. 1, March 1987, pp. 32–36 discloses a phase correction method but does not refer to the initially explained problem in the EPI method. Phase errors of the first order are thereby estimated by autocorrelation of the complex phase distortions of the image data, whereas a phase correction of the $0^{th}$ order is acquired from the histogram of the phase distribution of the image corrected with respect to the first order.

SUMMARY OF THE INVENTION

An object of the present invention is to provide a method for phase correction of nuclear magnetic resonance signals wherein only a small amount of measuring time is lost and with which a simple and optimally exact correction of the image data is achieved.

The above object is achieved in accordance with the principles of the present invention in a method for phase correction of nuclear magnetic resonance signals wherein image echoes are required under read out gradients with alternating operational signs and are entered row-by-row into a raw data matrix, and wherein a first navigator echo is acquired under a positive pulse of the read out gradient and a second navigator echo is acquired under a negative pulse of the read out gradient, with both first and second navigator echoes having the same phase encoding. Both of the navigator echoes are sampled, digitized and Fourier-transformed. A first linear phase response is obtained by autocorrelating the Fourier-transformed samples of the first navigator echo and a second linear phase response is obtained by autocorrelating the Fourier-transformed samples of the second navigator echo. Image echoes which are acquired under the positive pulses of the read out gradient, and which have been Fourier-transformed in the row direction of the raw data matrix, and then corrected using the first linear phase response. The image echoes acquired under negative pulses of the read out gradient, and Fourier-transformed in the row direction of the raw data matrix, are then corrected with the second linear phase response.

DESCRIPTION OF THE PREFERRED EMBODIMENTS

The basic features of the EPI method shall be described below with reference to the pulse diagrams of FIGS. 1–5. A more detailed disclosure of the EPI method may be found in U.S. Pat. No. 4,165,479.

A radio frequency pulse RF is emitted under the influence of a slice-selection gradient $G_S$, this radio frequency pulse RF exciting only a selected slice due to the slice-selection gradient $G_S$. After the excitation, pre-phasing gradients $G_{RV}$ in readout direction and $G_{PV}$ in a phase-encoding direction are activated. Subsequently, a readout gradient $G_R$ with individual pulses of alternating polarity is activated. Due to the alternating polarity, the resulting nuclear magnetic resonance signal is dephased and in turn re-phased each time, so that the signal curve S shown in FIG. 5 arises.

During the readout phase, further, a phase-encoding gradient $G_P$ in the form of individual pulses is activated between the individual signals S. The phase-encoding gradient effects a phase coding that is advanced step-by-step by the individual pulses. The readout gradient $G_R$, the phase-encoding gradient $G_P$ and the slice selection gradient $G_S$ reside perpendicularly to one another.

The information about the spatial origin of the signal contributions necessary for the imaging is coded in phase factors. For image acquisition, the nuclear magnetic resonance signals S that have been acquired are measured as complex quantities by phase-sensitive demodulation. The analog nuclear magnetic resonance signals that have been acquired are sampled in a time grid, the samples are digitized and entered per individual pulse of the readout gradient into a row of the raw data matrix M shown in FIG. 6. N complex values are read out under each individual pulse of the readout gradient $G_R$. These are sorted upon entry into a row of the raw data matrix M. The index i thereby indicates a row, the index j indicates a column. N individual pulses of the readout gradient $G_{RO}$ follow after every excitation, so that the raw data matrix M contains N rows. Overall, an N×N raw data matrix is obtained. This raw data matrix represents what is referred to as a k-space, whereby the following definitions apply:

$$k_R(t) = \gamma \int_0^t G_R(t')dt'$$

$$k_P(t) = \gamma \int_0^t G_P(t')dt', \text{ wherein}$$

γ=gyromagnetic ratio
$G_R(t')$=momentary value of the readout gradient $G_R$
$G_P(t')$=momentary value of the phase-encoding gradient $G_P$.

Figure 6:
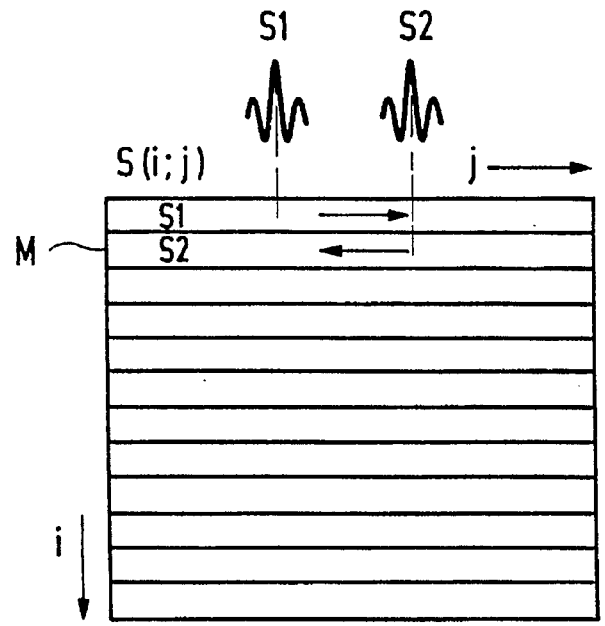
FIG. 6 illustrates the known sorting of measured data upon entry into a raw data matrix in the EPI method.

Since the individual nuclear magnetic resonance signals are read out under alternating polarity of the gradient $G_R$, the measured values must likewise be inserted into the raw data matrix in alternation with increasing j-values (column index) and decreasing j-values. The direction of the entry of the sampled and digitized nuclear magnetic resonance signals S1 and S2 is shown in FIG. 6.

An image can be acquired from the raw data matrix M or, expressed in different terms, from the k-space via a two-dimensional Fourier transformation:

$$S(k_x, k_y) = \iint \rho(x,y) e^{i(k_x \cdot x + k_y \cdot y)} dx dy,$$

whereby the locus coordinate x lies in the direction of the readout gradient $G_R$, the locus coordinate y lies in the direction of the phase-encoding gradient $G_P$ and $\rho(x,y)$ is the nuclear spin density at the location x,y in this case.

Figure 1:
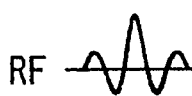
FIGS. 1–5 illustrate a known pulse sequence according to the EPI method for explaining the aforementioned problem.
Figure 2:
Figure 3:
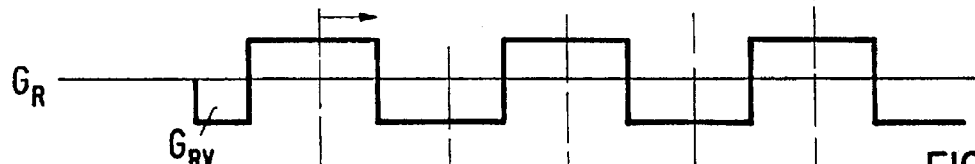
Figure 4:
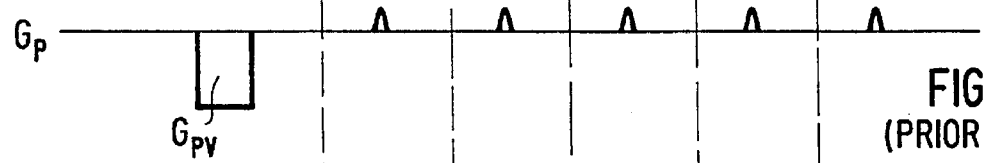
Figure 5:
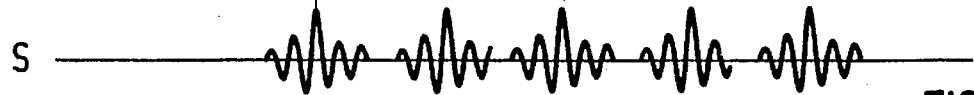

As already mentioned, EPI images are susceptible to N/2 ghosts because of the alternating sorting of the measured data. One cause of this, for example, can be that the sampling grid is not adjusted to the middle of the readout gradient pulses $G_R$ or, stated in more general terms, that the gradient grid and the sampling grid for the nuclear magnetic resonance signals are shifted relative to one another. In FIG. 3, such a shift of the gradient grid is indicated by an arrow. FIG. 6 schematically shows the position of two nuclear magnetic resonance signals S1 and S2 given such a shift. Due to the shift of the gradient grid in the direction shown in FIG. 3, the signal maximum in each k-space row shifts. As shown in FIG. 6, the alternating sorting of the measured values results in, for example, the nuclear magnetic resonance signals S1 and S2 now longer being under one another in the raw data matrix M. Stated in general terms, the maximum positions of the nuclear magnetic resonance signals alternate from row to row of the raw data matrix M. It should be noted that, given pulse sequences that do not have readout gradients alternating in operational sign, the nuclear magnetic resonance signal maxima are also disposed under one another in the raw data matrix when the gradient time grid is shifted relative to the sampling time grid. This occurs because all samples are sorted into the k-space from the same side of the raw data matrix.

Figure 7:
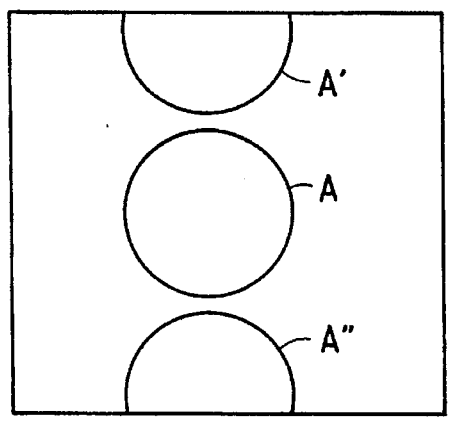
FIG. 7 illustrates the imaging of N/2 ghosts that occur in the prior art.

In EPI sequences, the sampling time for a sample of the nuclear magnetic resonance signal is typically between 0.5 through 4 µs. It has been shown that time shifts between the gradient time grid and the sampling time grid must be less than 1/20 of this sampling time in order to avoid N/2 ghosts. Otherwise, a shift leads to N/2 ghosts, as shown by example in FIG. 7. A subject A is thereby shifted both up and down by half the row number of the overall image matrix, so that the ghost images A' and A'' arise. The analog low-pass filtering always used in the signal editing can significantly contribute to the occurrence of this problem. Every filter has overshoots in the time domain that become more pronounced as the steepness of the filter increases in the frequency domain. The input signal is distorted in the positive time direction as a consequence of the causality principle. A signal shift with the above-noted consequences of the N/2 ghosts thus occurs.

After the Fourier transformation, the aforementioned signal shift leads to a linear phase response of the signal in the row direction. Further, a constant phase error can occur, for example given a drift of the basic magnetic field. Such a drift can be caused, for example, by eddy currents. After the Fourier transformation of the raw data matrix, thus, a phase response dependent on the column number i thus occurs overall in the row direction:

$$\phi(i) = \phi_0 + i \cdot \Delta\phi_1.$$

An exemplary embodiment of the invention shall now be set forth below, whereby both the constant and the linear term of the phase response are eliminated. As shown in FIGS. 8 through 12, two nuclear magnetic resonance signals $N^+$ and $N^-$ referred to as "navigator" echoes are acquired in a time phase $T_N$ preceding the actual pulse sequence for that purpose. After the excitation phase A, which is identical to that of FIGS. 1 through 5, the navigator echo $N^+$ is acquired under a positive pulse of the readout gradient $G_R$ and the navigator echo $N^-$ under a negative pulse of the readout gradient $G_R$. Both navigator echoes are acquired without the influence of a phase-encoding gradient.

After the time span $T_N$, the readout phase continues as in FIGS. 1 through 5.

Like all nuclear magnetic resonance signals, the navigator echoes $N^+$ and $N^-$ are demodulated with a phase-sensitive demodulator and are sampled as complex quantities and digitized. However, a complete matrix is not obtained since no phase-coding steps were implemented; rather, only one data row for the navigator echoes $N^+$ and $N^-$ is respectively obtained. Given exact centering of the navigator echoes $N^+$ and $N^-$ in the gradient grid, the result after a Fourier transformation would be purely real, i.e. no phase response would be present. An inadequate centering, however, leads to a linear phase response that can be identified on the basis of the following autocorrelation functions:

$$\begin{cases} \Sigma N_j^+ \cdot (N_{(j+1)}^+)^* = R^+ \cdot e^{i\Delta\phi_1^+} \\ \Sigma N_j^- \cdot (N_{(j+1)}^-)^* = R^- \cdot e^{i\Delta\phi_1^-} \end{cases}$$

$N_j^+$ and $N_j^-$ are respectively the individual Fourier-transformed, complex samples, the asterisk (*) represents the complex conjugate quantity, $R^+$ and $R^-$ respectively represent the magnitudes of the autocorrelation functions (of no interest in this context) and $\Delta\phi_1^+$ represents the phase response in the positive navigator echo $N^+$ and $\Delta\phi_1^-$ represents the phase response of the negative navigator echo $N^-$. The linear phase response of the signal is thus obtained separately for echoes under positive and negative gradients of the readout gradient $G_R$. It can be assumed that this phase response is the same for all following signals employed for image acquisition and that their phase response can thus be corrected.

In the illustrated method for determining the phase response, an averaging over the subject ensues on the basis of the sum formation of the samples, so that reliable values are obtained. Since the signal only comes from the subject region, it is substantially only the relevant subject region that is taken into consideration in the averaging.

A correction of the image signals can now be implemented with the phase responses for positive and negative pulses of the readout gradient acquired in this way, and the correction is again undertaken on the Fourier-transformed values in row direction of the raw data matrix. These values are referred to below as $H_{ij}$ and the corresponding, corrected values are referenced $H_{ij}'$. The corrected values $H_{ij}$ must be separately considered for signals under positive and negative pulses of the readout gradient $G_R$, i.e. even and odd row numbers i:

$$H_{ij}' = H_{ij} \cdot e^{i\left(j-\frac{N}{2}\right)\Delta\phi_1^+} \text{ for } i = 0(2)N-2, j = 0(1)N-1$$

$$H_{ij}' = H_{ij} \cdot e^{i\left(j-\frac{N}{2}\right)\Delta\phi_1^-} \text{ for } i = 1(2)N-1, j = 0(1)N-1$$

As already mentioned, there is not only a linear phase error $\Delta\phi_1$ but also a constant phase error $\Delta_0$. This constant phase error $\Delta_0$ can also be identified from the navigator echoes $N^+$ and $N^-$. To that end, the linear phase response of the navigator echoes itself is corrected with the values $\Delta\phi_1^+$ and $\Delta\phi_1^-$ that have already been acquired, whereby the corrected, Fourier transformed values in row direction are:

$$N_j^{+'} = N_j^+ \cdot e^{i\left(j-\frac{N}{2}\right)\Delta\phi_1^+}$$

$$N_j^{-'} = N_j^- \cdot e^{i\left(j-\frac{N}{2}\right)\Delta\phi_1^-}$$

The phase difference $\phi_0$ between the two echoes can now be calculated matrix pixel-by-matrix pixel from the aforementioned values for $N^{+'}_j$ and $N^{-'}_j$ with the following cross-correlation:

$$R \cdot e^{i\phi_0} = \sum_{j=0}^{N-1} N_j^{+'} (N_j^{-'})^*$$

The image signals Fourier-transformed in the row direction can now in turn be corrected with the value of the constant phase shift $\phi_0$ acquired in this way and likewise averaged over the subject, with only a correction of the odd-numbered echoes required, i.e., $$H_{ij}'' = H_{ij}' \cdot e^{i\phi_0} \quad i=1(2) \; N-1$$

Figure 8:
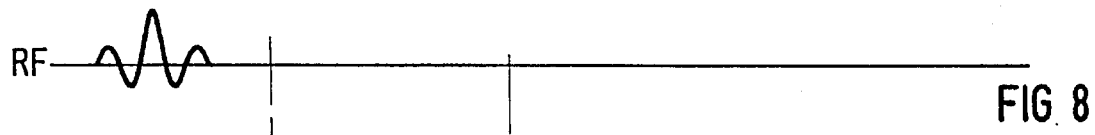
FIGS. 8–12 illustrate a pulse sequence with navigator echoes as an exemplary embodiment of the invention.
Figure 9:
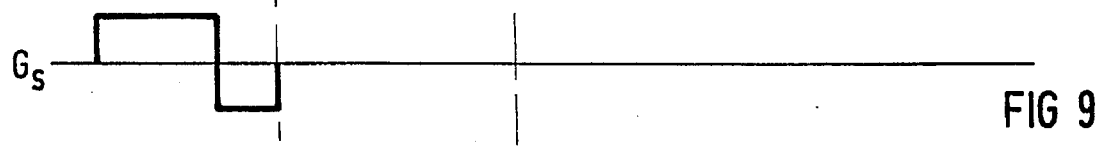
Figure 10:
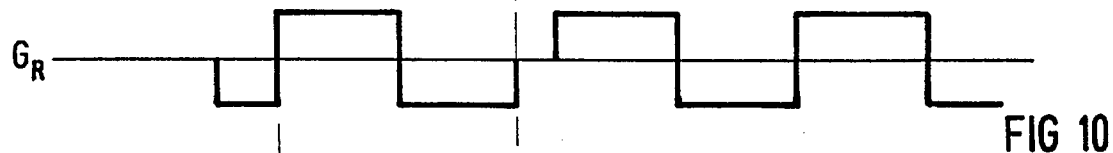
Figure 11:
Figure 12:
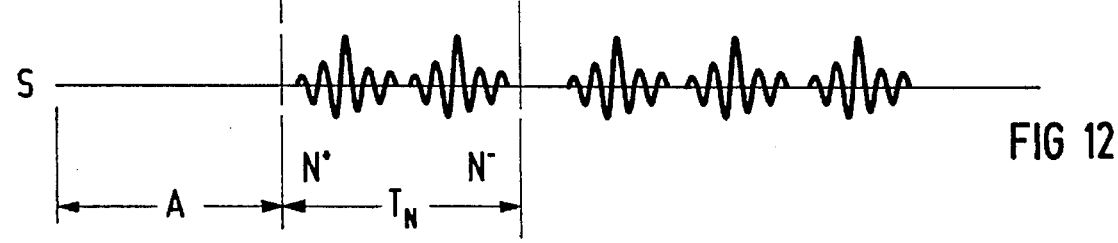
Figure 13:
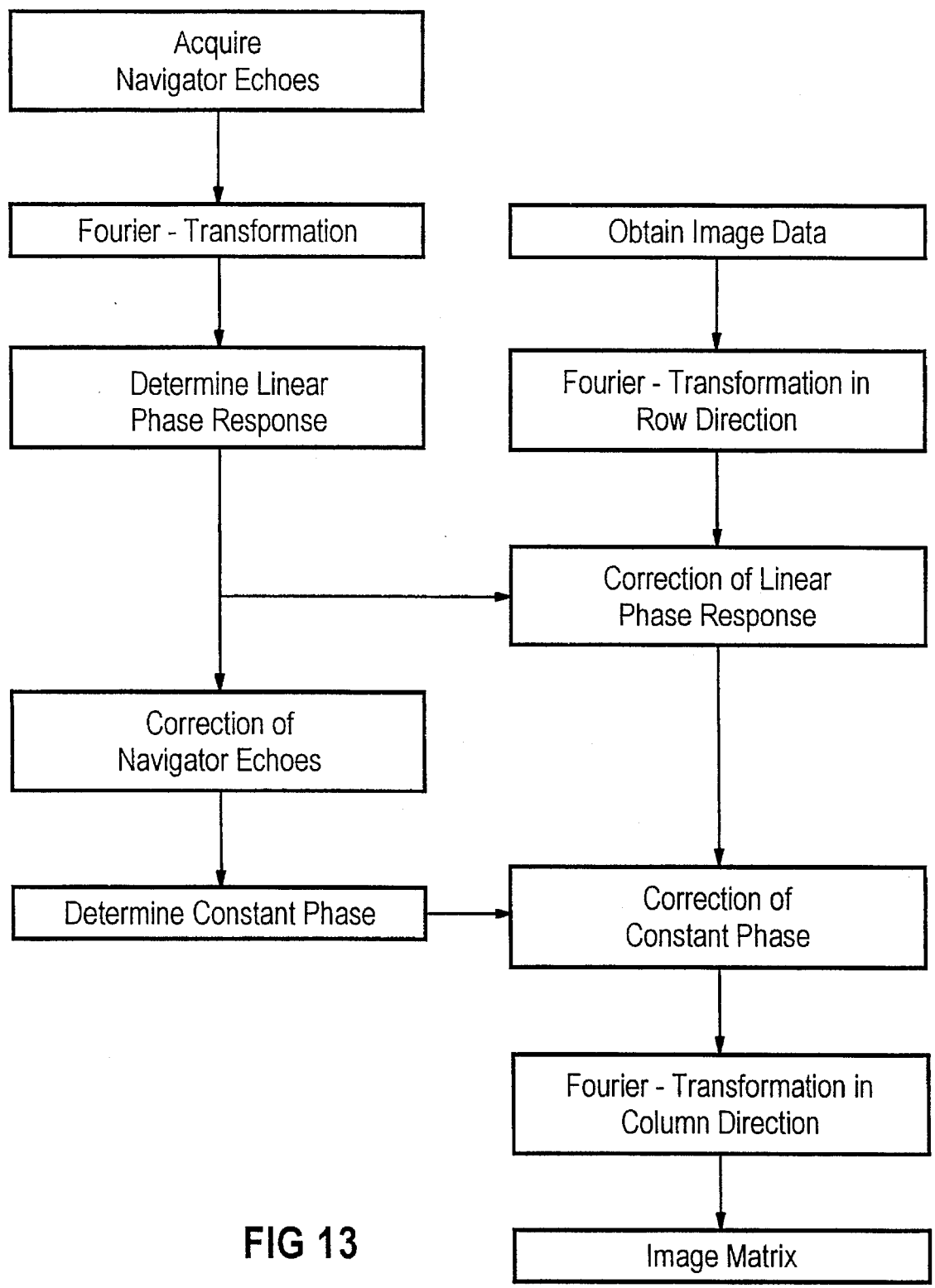
FIG. 13 is a flowchart of an exemplary embodiment of the invention.

The overall correction procedure is shown again in FIG. 8 with reference to a flowchart. First, navigator echoes and image echoes (image signals) are acquired. A Fourier transformation in the row direction ensues for the navigator echoes as well as for the image echoes. A linear phase response is then respectively determined for both navigator echoes with an autocorrelation function, the image echoes Fourier-transformed in line direction being corrected with this response. Further, the navigator echoes themselves are also corrected with the identified value of the linear phase response. A correction quantity $\phi_0$ for the constant phase response is obtained by cross-correlation of the corrected navigator echoes. A corresponding correction is applied to the image data. An image is finally obtained by Fourier transformation of the corrected matrix in the column direction.

A phase correction of nuclear magnetic resonance signals in the EPI sequences can be implemented with the aforementioned method both with respect to a constant and with respect to a linear term with little outlay, in particular with low time and calculating outlay. The correction operates reliably and exactly due to the averaging of the measured values utilized for the correction.

Although modifications and changes may be suggested by those skilled in the art, it is the intention of the inventor to embody within the patent worded hereon all changes and modifications as reasonably and properly come within the scope of his contribution to the art.

I claim as my invention:

1. A method for phase correction of nuclear magnetic resonance signals comprising the steps of:

acquiring image echoes in the present of read out gradients having alternating positive and negative operational signs;

entering said image echoes row-by-row into a raw data matrix;

acquiring a first navigator echo under a positive pulse of said read out gradient with a phase encoding;

acquiring a second navigator echo under a negative pulse of said read out gradient with the same phase encoding;

sampling each of said first and second navigator echoes to obtain first and second navigator echoes samples, digitizing said first and second navigator echo samples to obtain first and second digital samples, and Fourier-transforming said first and second digital samples to obtain first and second Fourier-transformed samples;

generating a first linear phase response by autocorrelating said first Fourier-transformed samples;

generating a second linear phase response by autocorrelating said second Fourier-transformed samples;

correcting image echoes acquired under positive pulses of said read out gradient and Fourier-transformed in a row direction of said raw data matrix using said first linear phase response; and correcting image echoes acquired under negative pulses of said read out gradient and Fourier-transformed in said row direction using said second linear phase response.

2. A method as claimed in claim 1 wherein the step of autocorrelating said first Fourier-transformed samples and the step of autocorrelating said second Fourier-transformed samples respectively comprise the following relationships:

$$\Sigma N_j^+ \cdot (N_{j+1}^+)^* = R^+ \cdot e^{i\Delta\phi+}$$

$$\Sigma N_j^- \cdot (N_{j+1}^-)^* = R^- \cdot e^{i\Delta\phi_1-}$$

wherein $N_j^+$ represents the first Fourier-transformed samples, $N_j^-$ represents the second Fourier-transformed samples, $(N_{j+1}^+)^*$ represents the complex conjugate of said first Fourier-transformed samples, $(N_{j+1}^-)^*$ represents the complex conjugate of the second Fourier-transformed samples, $R^+$ and $R^-$ represent the respective magnitudes of the autocorrelation functions, $\Delta\phi_1^+$ represents a phase difference between two successive first Fourier-transformed samples $N_j^+$ and $N_{j+1}^+$, and $\Delta\phi_1^-$ represents a phase difference between two successive second Fourier-transformed samples $N_j^-$ and $N_{j+1}^-$.

3. A method as claimed in claim 1 comprising the additional steps of:

correcting said first Fourier-transformed samples of said first navigator echoes using said first linear phase response to obtained corrected first navigator echoes;

correcting said second Fourier-transformed samples of said second navigator echoes using said second linear phase response to obtain corrected second navigator echoes;

identifying a constant phase shift between said first and second navigator echoes by cross-correlating said first corrected navigator echo with said second corrected navigator echo; and additionally correcting said image echoes using said constant phase shift.

4. A method as claimed in claim 3 wherein the step of cross-correlating said first and second corrected navigator echoes is performed by the function:

$$R \cdot e^{i\phi_0} = \sum_{j=0}^{N-1} N_j^+ (N_j^-)^*$$

wherein R represents a magnitude of the cross-correlation, $\phi_0$ represents said constant phase shift, $N_j^{+1}$ represents the first corrected navigator echo and $N^{j-1}$ represents the second corrected navigator echo.

5. A method as claimed in claim 3 wherein the step of additionally correcting said image echoes using said constant phase shift comprises additionally correcting only image echoes acquired under positive pulses of said read out gradient with said constant phase shift.

6. A method as claimed in claim 3 wherein the step of additionally correcting said image echoes using said constant phase shift comprises additionally correcting only image echoes acquired under negative pulses of said read out gradient with said constant phase shift.

* * * * *